United States Patent [19]

Welland et al.

[11] Patent Number: 5,039,989

[45] Date of Patent: Aug. 13, 1991

[54] DELTA-SIGMA ANALOG-TO-DIGITAL CONVERTER WITH CHOPPER STABILIZATION AT THE SAMPLING FREQUENCY

[75] Inventors: David R. Welland, Limerick, Ireland; Bruce P. Del Signore; Donald A. Kerth, both of Austin, Tex.

[73] Assignee: Crystal Semiconductor Corporation, Austin, Tex.

[21] Appl. No.: 429,211

[22] Filed: Oct. 27, 1989

[51] Int. Cl.[5] .............................................. H03M 3/02
[52] U.S. Cl. ..................................... 341/143; 341/118
[58] Field of Search ........................ 341/118, 143, 166

[56] References Cited

U.S. PATENT DOCUMENTS

| | | | |
|---|---|---|---|
| 4,509,037 | 4/1985 | Harris et al. | 341/143 |
| 4,542,354 | 9/1985 | Robinton et al. | 341/143 |
| 4,573,037 | 2/1986 | Robinton et al. | 341/118 |
| 4,896,156 | 1/1990 | Garverick | 341/143 |
| 4,912,423 | 3/1990 | Milkovic et al. | 330/9 |
| 4,939,516 | 7/1990 | Early | 341/143 |

Primary Examiner—J. R. Scott
Assistant Examiner—Marc S. Hoff
Attorney, Agent, or Firm—Gregory M. Howison

[57] ABSTRACT

A chopper stabilized analog-to-digital converter includes an analog modulator (10) and a digital filter (12). The analog modulator (10) is comprised of four integrators, a first integrator (20) which is continuous time and the remaining stages of integration (22) which are either continuous or discrete. The first integrator (20) is a chopper stabilized integrator which is comprised of a chopper stabilized differential amplifier (32) which has a single ended output and operates in a continuous time mode. The modulator has a zero that is located at the harmonics of the sampling frequency of the modulator and the chopping clock for the chopper stabilized operation operates at the sampling frequency.

22 Claims, 4 Drawing Sheets

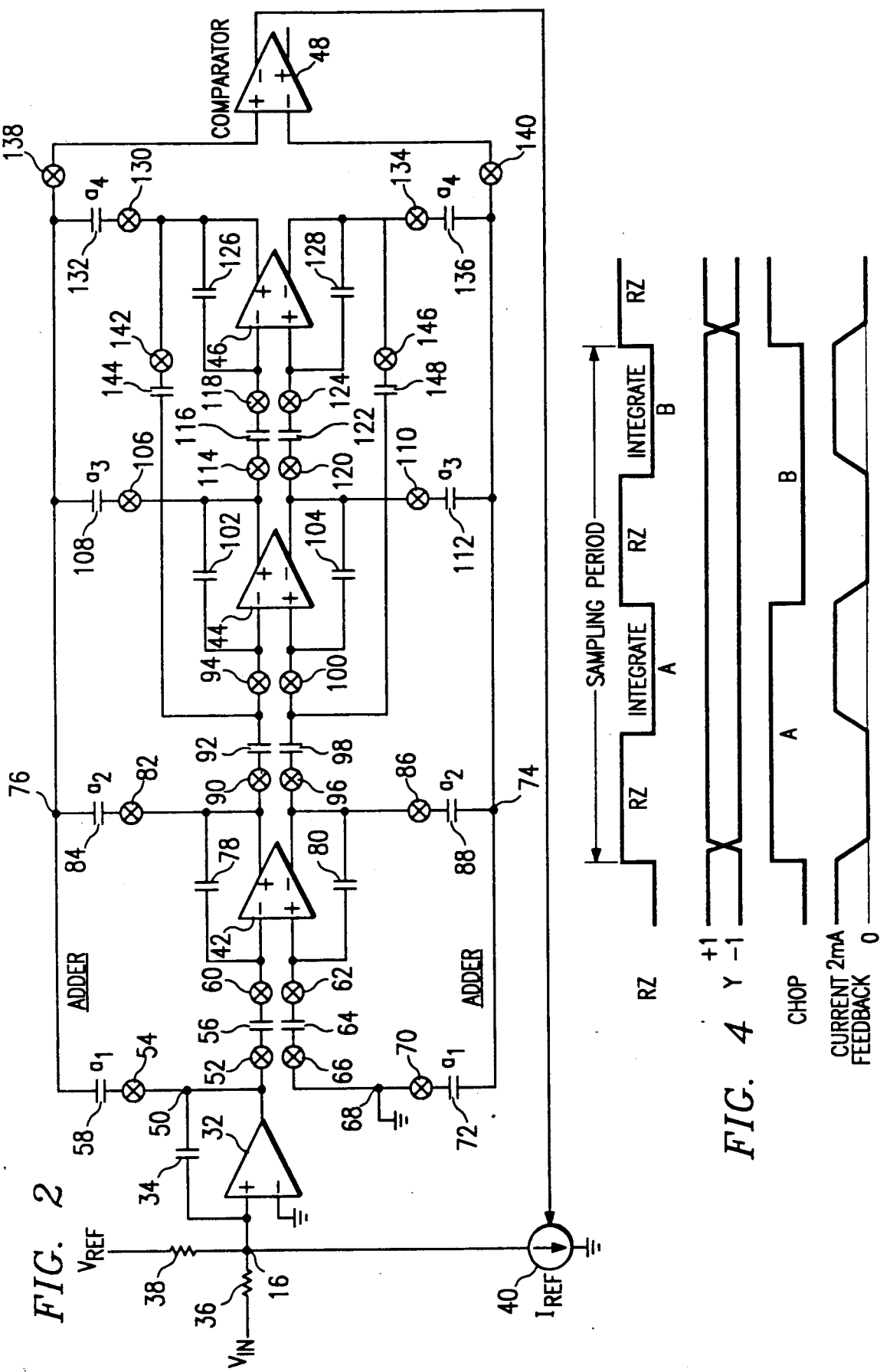

DELTA-SIGMA ANALOG-TO-DIGITAL CONVERTER WITH CHOPPER STABILIZATION AT THE SAMPLING FREQUENCY

TECHNICAL FIELD OF THE INVENTION

The present invention pertains in general to analog-to-digital converters and, more particularly, to an analog-to-digital converter using a chopper stabilized amplifier having a chopping frequency equal to the sampling frequency.

CROSS REFERENCE TO RELATED APPLICATION

This application is related to U.S. Pat. Application Ser. No. 205,996, filed June 13, 1988, and entitled CHOPPER STABILIZED DELTA-SIGMA ANALOG-TO-DIGITAL CONVERTER, now U.S. Pat. No. 4,939,516, U.S. Pat. Application Ser. No., 07/428,396 filed Oct. 27, 1989, entitled COMBINING CONTINUOUS TIME AND DISCRETE TIME SIGNAL PROCESSING IN A DELTA-SIGMA MODULATOR (Atty. Dkt. No. CRY-P1019A), U.S. Pat. Application Ser. No. 07/428,397 filed Oct. 27, 1989, entitled COMBINING FULLY-DIFFERENTIAL AND SINGLE-ENDED SIGNAL PROCESSING IN A DELTA-SIGMA MODULATOR, and U.S. Pat. Application Ser. No., 429,214 filed Oct. 27, 1989 and entitled DELTA-SIGMA MODULATOR WITH OSCILLATION DETECT AND RESET CIRCUIT (Atty. Dkt. No. CRYS-18,935).

BACKGROUND OF THE INVENTION

Analog-to-digital converters have seen increased use in recent years due to the advances in digital signal processing and the increased use of digital transmission systems. Typically, analog-to-digital converters comprise circuitry for receiving an analog input signal and outputting a digital value that is proportional to the analog input signal. This digital output value can either be a parallel word or a serial digital bit string. There are many types of analog-to-digital conversion schemes such as voltage-to-frequency converters, charge redistribution, delta modulation, etc. Each of these techniques has advantages and disadvantages associated therewith.

One type of analog-to digital converter that has seen increased use in recent years is that utilizing delta-sigma modulation wherein an analog voltage is input to a delta-sigma modulator and the output thereof filtered to remove noise. The delta-sigma modulator is of the type which converts an analog input to a digital pulse string having an average amplitude over time proportional to the analog input. One type of delta-sigma pulse modulator is described in U.S. Pat. No. 4,542,354, issued Sept. 17, 1985 to Robinson, et al. Delta-sigma modulation provides for high accuracy and wide dynamic range as compared to earlier delta modulation techniques. The delta-sigma type modulation is sometimes referred to as an oversampled converter architecture which is immune from some of the earlier undesirable second order effects of delta modulation.

There are two key components of a delta-sigma analog-to-digital converter, the analog modulator and the digital filter. The analog modulator oversamples the analog input and produces a low resolution digital output. However, with any analog-to-digital converter, there are a number of noise sources that are inherent to any analog modulator design. In a delta-sigma modulator, there are output stage noise sources and input stage noise sources, the output noise sources normally being dominated by quantization noise and the input noise sources resulting from DC offset and 1/f noise. The quantization noise at low frequencies is relatively low with the largest portion thereof existing at higher frequencies. This higher frequency portion of the noise can be filtered out by a digital domain low-pass filter. However, the low frequency DC offset and 1/f noise cannot be filtered out by a low-pass filter, and, as such, this noise will be passed through the filter with the signal information.

One approach to minimizing the low-frequency noise in an analog-to-digital converter utilizing a delta-sigma modulator is chopper stabilization, described in pending application, U.S. Pat. Ser. No. 205,996, filed June 13, 1988 by Adrian Early and assigned to the present Assignee, which application is incorporated herein by reference. In the pending application, the input integrator to the analog modulator is chopper stabilized at $F_S/2$. Although the chopper stabilization itself acts to minimize the low frequency noise, there still exists the possibility for the high frequency noise which exists at the $F_S/2$ and $F_S$ harmonics to be modulated downward into the baseband of the modulator. With the chopper stabilization of the pending application at $F_S/2$, the high frequency noise is filtered out at the output of the modulator with the post digital filter. However, internal to the modulator, the high frequency noise still exists. Since the chopping frequency is present, this can result in noise being modulated down from high frequencies into the baseband.

For DC inputs, the delta-sigma modulator output will be a series of 0's or 1's that will be repetitive at some integer multiple of the output word rate. The frequency response of this output bit stream will show natural tones which will rise above the quantization noise floor in the region of $F_s/4$ to $F_s/2$. Chopping can modulate these tones and the quantization noise of the converter at $F_s/2$ into the baseband. This will cause an increase in baseband noise and consequently, a decrease in dynamic range of the converter. Unfortunately, quantization noise in delta-sigma converters is usually at its maximum value at $F_s/2$.

SUMMARY OF THE INVENTION

The present invention disclosed and claimed herein discloses an analog-to-digital converter. The analog-to-digital converter includes an analog modulator which is operable to receive an analog input signal and convert it to a digital output signal having a value proportional to the analog input signal. The analog modulator includes at least one stage of amplification that is chopper stabilized. The one stage of amplification has a frequency response that provides a substantial amount of attenuation at the sampling frequency of the analog modulator. The amplifier is chopper stabilized at a chopping frequency equal to the sampling frequency, such that 1/f noise is shifted up in frequency to the harmonics of the sampling frequency. A digital filter is provided on the output to reject unwanted noise up to one-half the sampling frequency.

In another aspect of the present invention, the analog modulator is of the delta-sigma type. The first stage of integration includes at least one stage of amplification which is chopper stabilized. The modulator transfer function has a zero disposed at the sampling frequency of the delta-sigma modulator to provide the filtering in the modulator itself.

BRIEF DESCRIPTION OF THE DRAWINGS

For a more complete understanding of the present invention and the advantages thereof, reference is now made to the following description taken in conjunction with the accompanying Drawings in which:

FIG. 2 illustrates a more detailed diagram of the analog-to-digital converter of the present invention illustrating the combination of the continuous time first stage integrator;

FIG. 4 illustrates a timing diagram for the current feedback scheme;

DETAILED DESCRIPTION OF THE INVENTION

Figure 1:
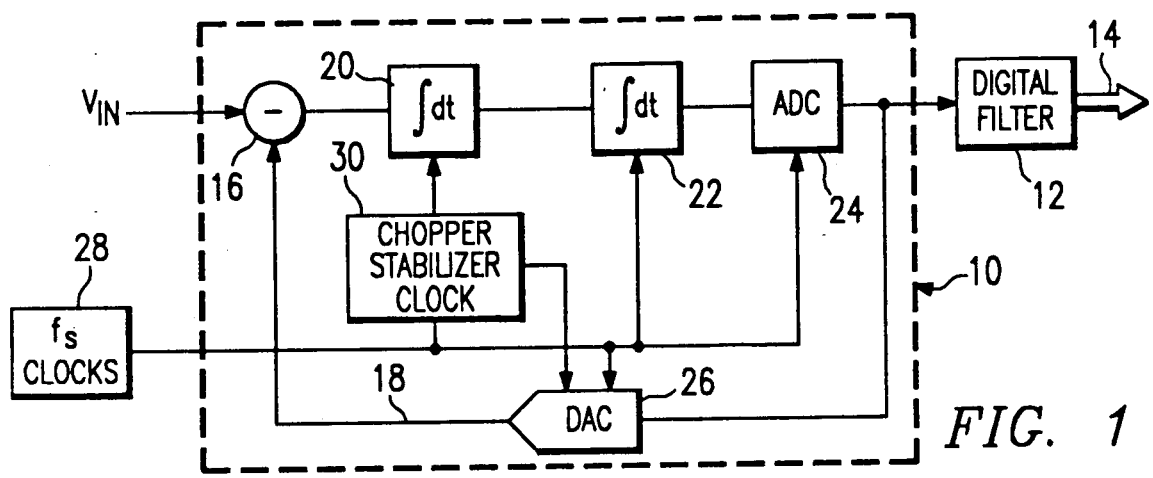
FIG. 1 illustrates a schematic block diagram of the analog-to-digital converter of the present invention.

Referring now to FIG. 1, there is illustrated a block diagram of the analog-to-digital converter of the present invention. The analog-to-digital converter is comprised of a delta-sigma type analog modulator 10 which is operable to receive an analog input voltage $V_{IN}$ and convert it into an output pulse string having an average amplitude over time proportional to the analog input voltage. The output of the analog modulator 10 is input to a digital filter 12 to filter undesired signal and noise to provide a filtered output on a digital bus 14.

The analog modulator 10 has a summing junction 16 for receiving the analog input voltage $V_{IN}$ and summing it with a feedback signal on a feedback line 18. The output of the summing junction 16 is input to a first integrator 20. The first integrator 20 is a chopper stabilized continuous time integrator, as will be described in more detail hereinbelow. The first integrator 20 has the output thereof input to a second stage of integration 22, which is comprised of three integration stages to provide a fourth order loop. The output of the second stage 22 is input to an analog-to-digital converter (ADC) 24, the output of which provides a digital string of pulses. The output of the ADC 24 is connected to the input of a digital-to-analog converter (DAC) 26, the output of which comprises the feedback line 18, the DAC being chopper stabilized also. The second stage of integration 22, the ADC 24 and the DAC 26 have the clock inputs thereof connected to the output of a sample clock circuit 28 that operates at a frequency $F_S$. In addition, the sample clock circuit 28 is input to a chopper stabilized clock circuit 30 for generating a chopping clock $F_{CH}$ which operates at a frequency that, in the preferred embodiment, is the sampling clock $F_S$ generated by circuit 28. As will be described hereinbelow, the 1/f noise and DC offset errors associated with the first integrator are translated to a higher frequency by the first integrator 20 which is chopper stabilized at the sampling frequency, which sampling frequency has a zero associated therewith in the analog modulator, which will be described in more detail hereinbelow.

The analog modulator 10 is operable to oversample the analog input and produce a low-resolution digital output. Typically, the ADC 24 and the DAC 26 have one bit of resolution, with the ADC 24 being realized with a comparator and the DAC 26 feeding back only one of two values, plus or minus full-scale in a current feedback scheme. With only two output levels, the DAC 26 is inherently linear. Overall modulator linearity is limited primarily by non-idealities in the DAC 26.

Referring now to FIG. 2, there is illustrated a detailed block diagram of the analog modulator 10 of FIG. 1. The first integrator 20 is a continuous time single ended amplifier 32 having the positive input thereof connected to the ground and the negative input thereof connected to the summing node 16. A feedback capacitor 34 is connected between the negative input and the output of the continuous time amplifier 32. The summing node 16 is connected to the input voltage $V_{IN}$ through resistor 36 and also to a reference voltage $V_{REF}$ through a resistor 38. Summing node 16 is also connected to the negative supply through a current source 40. The resistor 38 and the current source 40 provide the current feedback, as will be described in more detail hereinbelow.

The second stage of integration 22 is comprised of three separate stages of integration, as described above, each stage comprising a differential amplifier 42, 44 and 46, respectively, and having differential inputs and differential outputs. Each of the differential amplifiers 42–46 are connected in series with both feedforward and feedback paths for connection to the differential input of a sampling comparator 48. In addition, the differential amplifiers 42–46 are connected in a switched capacitor integrator configuration.

The output of the amplifier 32 is connected to an output node 50. The output node 50 is connected to both a switch 52 and a switch 54. Each of the switches 52 and 54 have the other side thereof connected to one plate of a capacitor 56 and 58, respectively. The switch 52 and capacitor 56 comprise an input leg to the next stage, whereas the switch 54 and the capacitor 58 represent a feed forward leg. Each of the switches 52 and 54, in addition to the remaining switches described hereinbelow, are comprised of a series switch and a shunt switch with the shunt switch being connected between the plate of the associated capacitor and ground and the series switch operable to either isolate the associated capacitors 58 and 56 from the node or to connect the node 50 to the capacitors. Each of the switches 52 and 54 alternate operation of the series and shunt switches such that the series switch is closed when the shunt switch is open, or vice versa.

The other side of the capacitor 56 is connected through a switch 60 to the negative input of amplifier 42. The positive input of the amplifier 42 is connected to one side of the switch 62, similar to switch 60, the other side of which is connected to one plate of a capacitor 64. The other side of capacitor 64 is connected to one side of a switch 66, the other side of switch 66 connected to a node 68, which is a feed forward node. Node 68 is connected to ground and also to one side of a switch 70. Switch 70 is similar to switch 54 in the operation thereof with the other side thereof connected to one plate of a capacitor 72, the other plate of which is connected to the feed forward node 74. In a similar manner, the other plate of capacitor 58 is connected to a feed forward node 76.

The differential amplifier 42 has two feedback capacitors 78 and 80 connected between the negative input and the positive output, and between the positive input and negative output, respectively. The positive output of amplifier 42 is connected to a series combination switch 82 and capacitor 84 which are connected to feed forward node 76, with the capacitor 84 connected on one side to node 76. In a like manner, the negative output of amplifier 42 is connected to feed forward node 74 through a series combination switch 86 and capacitor 88. The positive output of amplifier 42 is also connected to the negative input of amplifier 44 through a switch 90, capacitor 92 and switch 94 combination, similar to the switch 52, capacitor 56 and switch 60 combination. In like manner, the negative output of amplifier 42 is connected to the positive input of amplifier 44 through a switch 96, capacitor 98 and switch 100 configuration. Feedback capacitors 102 and 104 are provided for connection between the negative input and the positive output and between the positive input and negative output of amplifier 44, respectively.

The positive output of amplifier 44 is connected to the feed forward node 76 through a series combination switch 106 and capacitor 108 and the negative output thereof is connected to feed forward node 74 through a series combination switch 110 and capacitor 112. The positive output of amplifier 44 is connected to the negative input of amplifier 46 through a switch 114, capacitor 116 and switch 118 combination, with the negative output thereof connected to the positive input of amplifier 46 through a switch 120, capacitor 122 and switch 124 combination. Feedback capacitors 126 and 128 are provided between the negative input and positive output, and between the positive input and negative output of amplifier 46, respectively.

The positive output of the amplifier 46 is connected through a switch 130 and capacitor 132 series combination to a feed forward node 76, and the negative output thereof is connected to the feed forward node 74 through a series combination switch 134 and capacitor 136. Feed forward node 76 is connected through a switch 138 to the positive input of the sampling comparator 48, and the feed forward node 74 is connected through a switch 140 to the negative input of the sampling comparator 48. It should be understood that switches 138 and 140 have the associated shunt switch configured such that it is on the capacitor side of the switches at the feedback node 76 and 74, respectively.

A feedback path is also provided from the positive output of the amplifier 46 to the connection between switch 94 and capacitor 92 on the negative input of the amplifier 44. The feedback path is comprised of a switch 142 connected between the positive output of amplifier 46 and one side of the capacitor 144, the other side of capacitor 144 connected between capacitor 92 and switch 94. In a similar manner, a feedback path is provided between the negative output of the amplifier 46 and the positive input of amplifier 44. A switch 146 has one side thereof connected to the negative output of the amplifier 46 with the other side thereof connected to one side of the capacitor 148. The other side of capacitor 148 is connected between capacitor 98 and switch 100. The negative output of the comparator 48 is connected to the control input for the current source 40 to provide the one bit DAC operation.

In operation, the switches in FIG. 2 are configured such that the switches operate in either a shunt mode or a series mode. In general, the timing is such that some of the switches have their series switch closed during the first quarter of the sampling period, and vice versa for the remaining portion of the sampling period. In each of the switch combinations between the input and outputs of the amplifier stages, the first switch has the series switch closed and the second switch has the shunt switch closed during the first quarter of the sampling period (i.e., switches 52 and 66 with series closed and switches 60 and 62 with shunt closed). During the first quarter of the sampling period, the switches in the feed forward legs have the shunt switches closed (i.e., switches 54, 70, 82, 86, 106, 110, 130, 134, 138 and 140, and also switches 142 and 146 in the feedback legs). This is reversed for the remaining three fourths of the sampling period.

Figure 3:
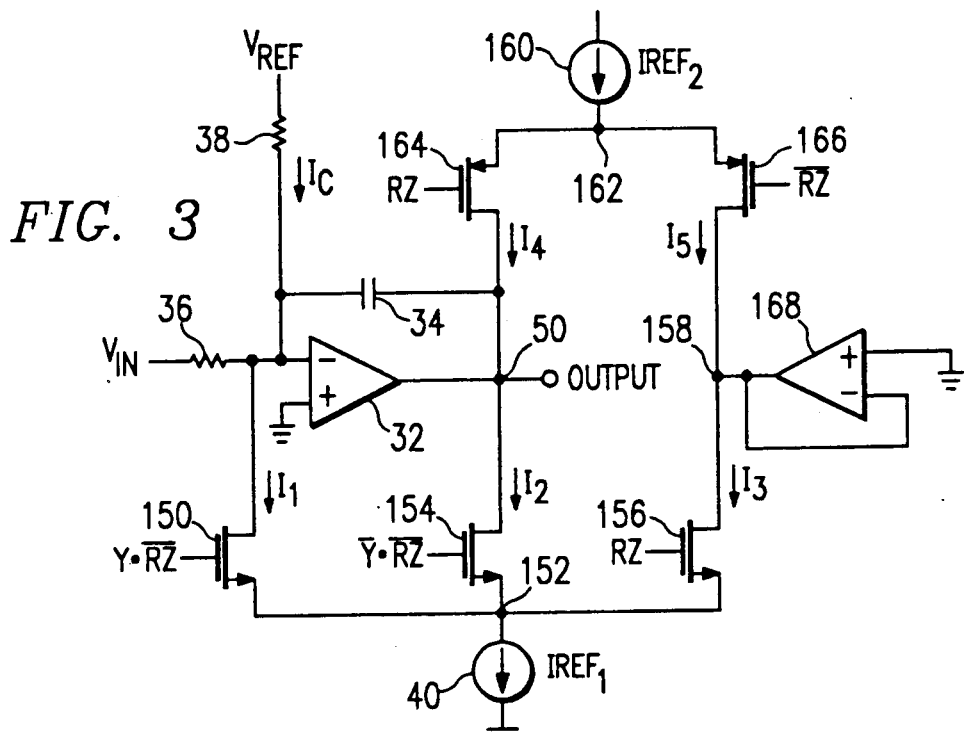
FIG. 3 illustrates a simplified block diagram of the continuous time first stage illustrating the current feedback schematic.

Referring now to FIG. 3, there is illustrated a detail of the current feedback scheme. An N-channel transistor 150 has the source-to-drain path thereof connected between the negative input to amplifier 32 and a node 152, node 152 representing the input to the current source 40. An N-channel transistor 154 has the source-to-drain path thereof connected between the output node 50 and node 152. N-channel transistor 156 has the source-to-drain path thereof connected between a reference node 158 and the node 152. The gates of transistors 150, 154 and 156 are connected to control input signals, as will be described hereinbelow with respect to FIG. 4. A second reference current source 160 is provided for being connected between the positive supply and a node 162. A P-channel transistor 164 has the source-to-drain path thereof connected between node 162 and output node 50. A P-channel transistor 166 has the source-to-drain path thereof connected between the node 162 and the reference node 158. A reference amplifier 168 is provided for establishing a reference ground at node 158. As will be described hereinbelow, the current reference 40 represents a chopped reference, and therefore, two current sources are actually implemented therein.

Figure 3A:
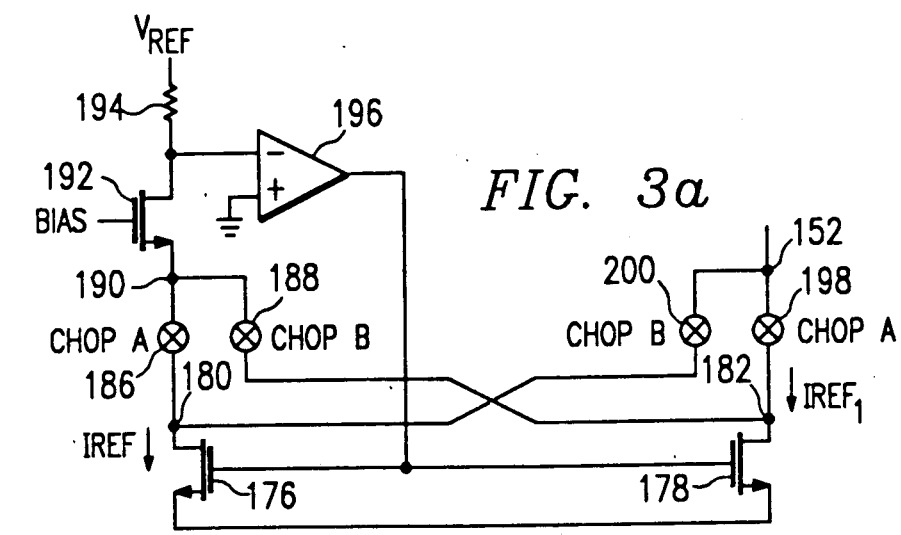
FIG. 3a illustrates a schematic diagram of the current reference.

Referring now to FIG. 3a, there is illustrated a detail schematic diagram of the current reference and the chopping operation thereof. Two current mirror transistors 176 and 178 are provided which are mirrored transistors. The source-to-drain path of transistor 176 is connected between the negative supply voltage and the node 180. In a similar manner, the transistor 178 has the source-to-drain path connected between the negative supply voltage and a node 182. Two switches 186 and 188 are provided with switch 186 operable to selectively connect node 180 with a node 190, and switch 188 is operable to selectively connect node 182 to node 190. Node 190 is connected through the source-to-drain path of a transistor 192 to an external resistor 194, which has the other end thereof connected to a reference voltage. The other side of the source-to-drain path of transistor 192 is also connected to the negative input of a chopper stabilized op amp 196, the positive input of which is connected to the ground and the output of which provides the bias voltage on the gates of transistors 176 and 178. Two switches 198 and 200 are provided, with switch 200 operable to selectively connect node 180 to node 152 and switch 198 is operable to selectively connect node 182 to node 152. Node 152, as described above, is the current reference node through which $I_{REF}$ is established.

In operation, the chopping frequency, as illustrated in FIG. 4 hereinbelow, closes the switches 186 and 198 during the A portion of the chopping waveform, and opens switches 188 and 200. During the B portion of the waveform, switches 188 and 200 are closed and switches 186 and 198 are open. During the A portion, a reference current passes from transistor 192 through transistor 176 and a mirrored reference current passes from node 152 through transistor 178. On the other hand, in the B portion of the chopping cycle, the reference current passes through transistor 192 and transistor 178 and the mirrored reference current passes through the transistor 176. The switches 186, 188, 198 and 200 chop the current through node 152. This chopping reduces the 1/f noise of transistors 176 and 178, which are the main noise contributors.

Referring further to FIG. 4, there is illustrated a timing diagram for the operation of the current feedback scheme of FIG. 3. The sampling period is four microseconds long and is generally controlled by a clock RZ which represents a return to zero clock. The RZ clock has two periods within the sampling period going from a logic high to a logic low. A Y-output is provided which is the one bit DAC feedback and is either at a +1 or a −1 logic level. A chop signal is provided which, as described above, operates at $F_S$ and, therefore, it is one cycle long during the sampling period and goes from a logic high to a logic low with the logic high state represented by the A portion and the logic low portion thereof represented by the B portion. The current that is fed back is the current to the transistor 150 as represented by the current $I_1$, which varies from a value of zero to 2 ma.

The current $I_1$ is the feedback signal which is only present for the one bit signal Y, equal to a +1. It also only occurs when RZ is low. The current through the transistor 154 is represented by current $I_2$ which is turned on only when Y is equal to a −1 and RZ is low. Transistor 154 is needed in order to keep glitches due to the current feedback on the summing node independent of data.

The transistor 156 has a current $I_3$ flowing therethrough. This transistor 156 is turned on during the high logic state of RZ to maintain a constant supply of current to the reference current source 40. A current $I_4$ flows through transistor 164 and the transistor is turned on for either state of the digital feedback signal Y when RZ is low. This linearizes the first integrator, since it does not have to sink any feedback current. The transistor 166 has a current $I_5$ flowing therethrough, transistor 166 being turned on during the time RZ is at a logic high to maintain a constant supply of current. The current through resistor 38 is labelled $I_6$ and provides an offset current since the feedback current is being enabled for Y equal to a logic one.

Figure 5:
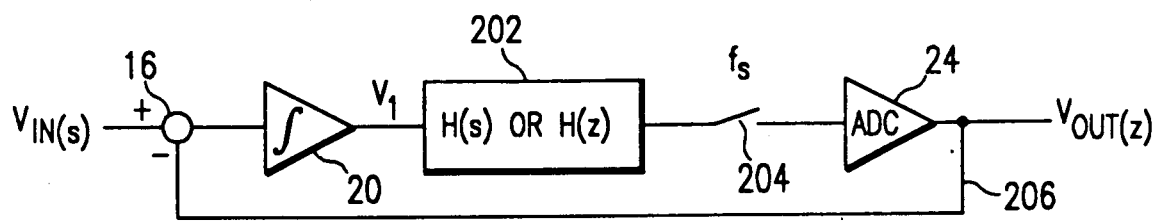
FIG. 5 illustrates the continuous time modulator transfer function of the first stage integrator combined with the loop filter.

Referring now to FIG. 5, there is illustrated a block diagram of the analog modulator showing the transfer function. The continuous time integrator 20 is output to a general loop filter which can be either continuous or discrete, which represents the integrator 22 of FIG. 1. This is represented by a block 202 with a continuous time transfer function represented by H(s) and the discrete time transfer function represented by H(z). The output of the filter is input to a sampling switch 204 that operates at a sampling frequency $F_s$, which is equal to 1/T where T is equal to the sampling period. The output of the switch 204 is input to the ADC 24. The feedback digital-to-analog path 206 is provided to represent the discrete-time feedback to the summing junction 16. For the transfer function, it is assumed that due to the loops negative feedback, the state variable $V_1$ on the output of the continuous time integrator 20 is nearly equal to zero $V_1$ is positive or negative and the loop would react to drive $V_1$ toward zero. The relationship for the transfer function is as follows:

$$V_1(t) = \int_0^t (V_{IN}(t) - V_{OUT}(t))\, dt \approx 0$$

$$= \int_0^t V_{IN}(t)\, dt - \int_0^t V_{OUT}(t)\, dt \approx 0$$

Since $V_{OUT}(t)$ is a discrete-time variable $$V_2(t) = \int_0^t V_{IN}(t)\, dt - \sum_{n=0}^{t/T} V_{OUT}(nT)\, T \approx 0$$

Take the Laplace Transform:

$$V_1(s) = 1/s\, V_{IN}(s) - V_{OUT}(s) \frac{T}{1 - e^{-sT}} \approx 0$$

$$V_{OUT}(s) \approx V_{IN}(s)\, [1 - e^{-sT}]/sT$$

$$V_{IN}(s)\, e^{-sT/2}\, (e^{+sT/2} - e^{-sT/2})/sT$$

$$V_{OUT}(s) \approx V_{IN}(s)\, e^{-sT/2}\, \sin(sT/2)/(sT/2)$$

The transfer function of $V_{OUT}/V_{IN}$ is:

$$\frac{\sin(T/2)}{T/2} \rightarrow \frac{\sin(\pi fT)}{\pi fT}$$

which has zero's at $\pi fT = n\pi$ or $f = nf_s$

Figure 6:
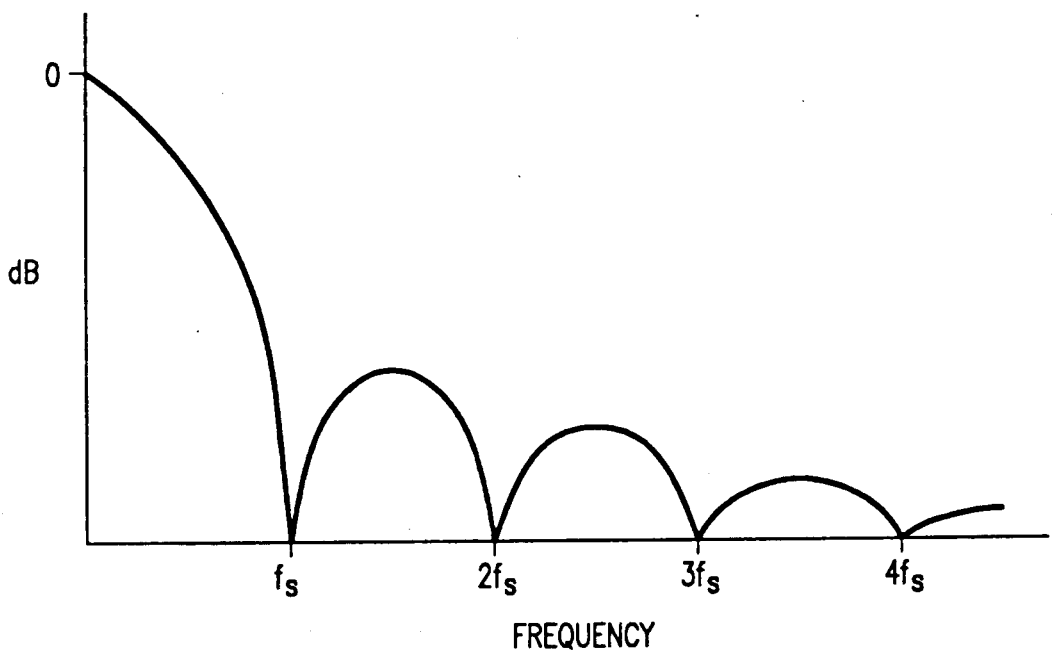
FIG. 6 illustrates the frequency response of the analog modulator.

It can be seen from the above transfer function that the zeros occur at $nF_s$ with n as an integer, such that at every harmonic of $F_s$, there is a zero. This is illustrated in FIG. 6, wherein the response of 0 dB at DC has a zero at $F_s$ at every harmonic thereof. The sampling frequency in the preferred embodiment is 256 kHz with the attenuation at 500 Hz being equal to approximately −0.0001 dB and the attenuation at $F_s \pm 500$ Hz being equal to approximately −54 dB.

By utilizing a chopping scheme that operates at the converter's sampling frequency $F_s$, flicker noise reductions, DC offset and long term stability improvements are realized. As compared to chopping at $F_s/2$ or lower frequencies, $F_s$ chopping provides increased Dynamic Range due to a reduction of tones present in the baseband, minimization of all $F_s/2$ digital signals on the chip and a reduction of flicker noise by the modulator as opposed to the digital filter.

Figure 7:
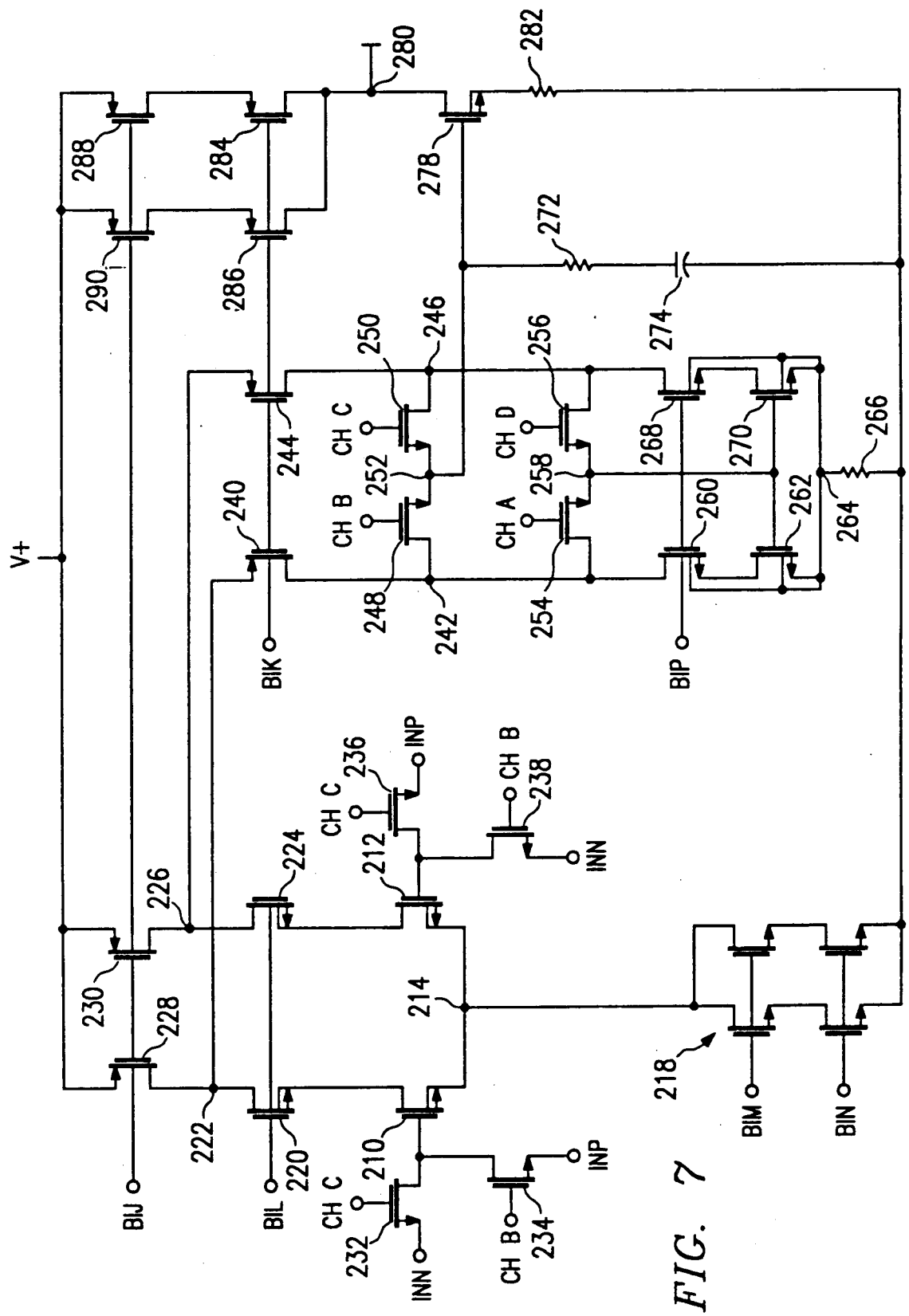
FIG. 7 illustrates a detailed schematic diagram of the continuous time integrator of the first stage.

Referring now to FIG. 7, there is illustrated a detailed schematic diagram of the continuous time integrator 32. The first stage differential amplifier is comprised of two differential N-channel transistors 210 and 212, the sources of which are tied to a node 214. The node 214 is connected to the negative supply voltage through a current source 218. The drain of transistor 210 is connected through the source-to-drain path of an N-channel transistor 220 to a node 222 and the drain of transistor 212 is connected through the source-to-drain path of an N-channel transistor 224 to a node 226. Node 222 is connected through the drain-to-source path of a P-channel transistor 228 to the positive supply voltage, and node 226 is connected through the drain-to-source path of a P-channel transistor 230 to the positive supply voltage. The gates of P-channel transistors 228 and 230 are tied together and to a bias voltage and the gates of transistors 220 and 224 are tied together and to a separate bias voltage.

The gate of transistor 210 is connected to one side of a pass transistor 232 and also to one side of a pass transistor 234. The other side of the pass transistor 232 is connected to the inverted input voltage INN, and the other side of pass transistor 234 is connected to the non-inverted input INP. The gate of transistor 232 is connected to the chopping signal chc and the gate of transistor 234 is connected to a chopping signal chb.

The gate of transistor 212 is connected to one side of a pass transistor 236, the other side of which is connected to the non-inverted input INP. The gate of transistor 212 is also connected to one side of a pass transistor 238, the other side of which is connected to the inverted input INN. The gate of transistor 236 is connected to the chopping signal chc and the gate of transistor 238 is connected to the chopping signal chb. The above circuitry describes a first stage of the amplifier 32.

Node 222 is connected through the source-to-drain path of the P-channel transistor 240 to a node 242 and the node 226 is connected through the source-to-drain path of a P-channel transistor 244 to a node 246. Two series-connected pass transistors 248 and 250 are connected between nodes 242 and 246 with the sources thereof tied together at a node 252. The gate of pass transistor 248 is connected to the chopping signal chb that is operable to connect node 242 to node 252 and the gate of pass transistor 250 is connected to chopping signal chc to selectively connect node 246 to node 252. In a similar manner, two series pass transistors 254 and 256 are provided between nodes 242 and 246 to selectively connect nodes 242 and 246 to a node 258, respectively, and the gates thereof are connected to chopping signals cha and chd, respectively.

Two series-connected N-channel transistors 260 and 262 are connected between node 242 and a node 264, node 264 connected to the negative supply voltage through a resistor 266. In a similar manner, two series-connected N-channel transistors 268 and 270 are connected between node 246 and node 264. Gates of transistors 262 and 270 are connected together and to node 258, and the gates of transistors 268 and 260 are connected to a bias reference voltage. Node 252 represents an output node and has an RC filter connected from node 252 to the negative supply voltage. The RC network is comprised of a resistor 272 and a capacitor 274.

Node 252 is connected to the gate of a transistor 278, the source-to-drain path thereof connected between an output node 280 and one end of a resistor 282. The other end of resistor 282 is connected to the negative supply voltage. Two P-channel transistors 284 and 286 are connected in parallel, with the source-to-drain path thereof connected on one end thereof to the node 280 and the gate thereof connected to the gates of transistors 240 and 244 and to a bias voltage. The other end of the source-to-drain paths of transistors 284 and 286 are connected to one end of the source-to-drain paths of two parallel connected P-channel transistors 288 and 290. The other end of the source-to-drain paths of transistors 288 and 290 are connected to the positive supply voltage. The gates of transistors 288 and 290 are connected to the gates of transistors 228 and 230. P-channel transistors 286-290 provide a load to the output transistor 278.

With the use of the chopping signals cha, chb, chc and chd, a chopper stabilized differential amplifier is realized. Chopper stabilized differential amplifiers have been utilized to enhance the low frequency noise operation of differential amplifiers. The operation of the chopper stabilized amplifier is generally described in U.S. Pat. No. 4,138,649, issued to G.L. Scheaffer on Feb. 6, 1979. They are utilized to cancel out low frequency (1/f) noise. This noise is concentrated at low frequencies and arises from surface states in the channel of the MOS transistors. The magnitude of the low frequency noise component is dependent on the process used, the design of the differential amplifier used and the size of the transistors used in the differential amplifier.

The chopper stabilized amplifier translates the noise energy from the baseband to some higher frequency so that it does not contaminate the signal at the baseband. Chopper stabilization results in modulation of the noise to odd harmonic frequencies of the chopping square wave. This results in an equivalent input noise spectrum where the 1/f noise component has been shifted to the odd harmonic frequencies of the chopping square wave. The 1/f noise density at low frequencies is equal only to the folded back noise from the harmonics of the 1/f and thermal noise components. Therefore, if the chopper frequency is much higher than the bandwidth of the baseband signal, the 1/f noise of the signal band would be greatly reduced by the use of chopper stabilization. Typically, in analog applications such as DC precision amplifiers, a low pass analog filter is used on the output to filter the chopper stabilized amplifier. However, with chopper stabilization at $F_s$ and with the existence of a zero in the analog modulator of the present invention at $F_s$, filtering is provided in the analog modulator itself. Even though the chopping frequency is outside the baseband of the signal, the existence of a zero at the sampling frequency further enhances the operation and reduces noise that can exist in the modulator. In the present invention, the chopper frequency $F_{CH}$ is set at $F_s$ such that the noise is modulated to $F_s$, $3F_s$, $5F_s$, etc. Since the modulator has a zero that exists at each harmonic of $F_s$, this will result in significant reduction of the chopping frequency components.

Figure 8:
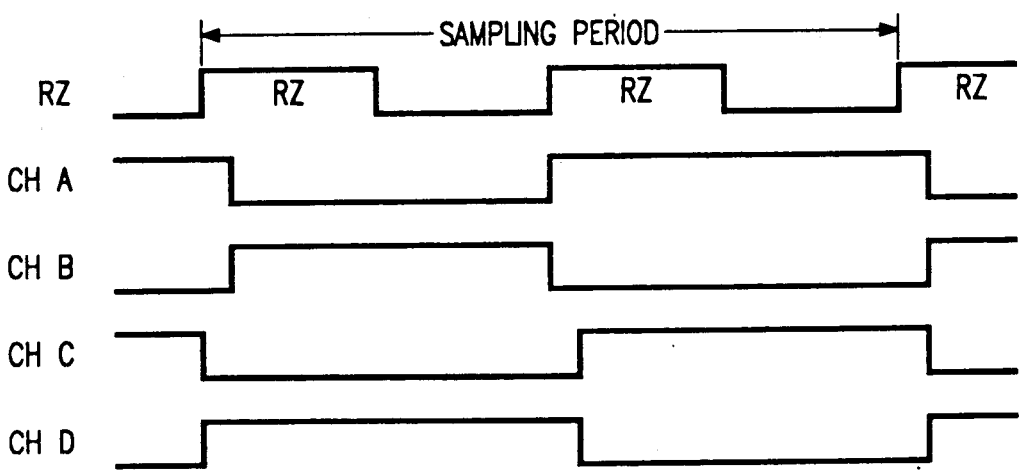
FIG. 8 illustrates a timing diagram for the chopped operation of the first stage.

Referring now to FIG. 8, there is illustrated a timing diagram for the chopping scheme. It can be seen that the RZ clock makes two cycles in each sampling period, and each of the chopping signals cha, chb, chc and chd cycles once during the sampling period. The chopping clocks cha and chb are the inverse of each other and the chopping clocks chc and chd are the inverse of each other. Chopping clock cha and chb, relative to chopping clocks chc and chd, are non-overlapping clocks.

Integration occurs only when the RZ clock is low. Chopping does not occur during this integration step and only occurs when RZ is high. In this manner, the chopping switches are switched to allow the amplifier 32 to settle such that any change in the state of the internal switches in the amplifier 32 occurs after sampling and prior to integration. This insures that the amplifier 32 is settled after any operation of the switches for both the chopping operation and for the switched capacitor operation, as described above with respect to FIG. 2.

The digital filter 12 is comprised of a three-stage finite impulse (FIR) filter. The first FIR in the preferred embodiment is fabricated on chip, with the remaining two FIRs fabricated using a digital signal processor (DSP). The digital filter provides the correct output response and filters out unwanted harmonics at the out of band frequencies.

In summary, there has been provided an analog-to-digital converter utilizing a chopper stabilized analog modulator. The analog modulator includes first and remaining integrators, of which the first integrator is a continuous time integrator and the remaining integrators are either continuous or discrete time. The chopping frequency of the chopper stabilized amplifier is synchronized with the sampling frequency of the modulator and also set at one of the harmonics of the sampling frequency. The continuous time first stage of integration inherently provides zeroes at the harmonics of the sampling frequency such that any noise due to chopper stabilization is filtered out in the analog modulator in the first stage of integration.

Although the preferred embodiment has been described in detail, it should be understood that various changes, substitutions and alterations can be made therein without departing from the spirit and scope of the invention as defined by the appended claims.

What is claimed is:

1. An analog-to-digital converter, comprising:
   an analog modulator operating at a predetermined sampling frequency for receiving an analog signal and converting the received analog signal to a digital output signal which is representative of the analog input signal, said analog modulator having undesirable low frequency noise associated therewith;
   said analog modulator having a noise transfer function that provides a substantial amount of attenuation at a predetermined chopping frequency;
   said analog modulator having at least one stage of filtering having a predetermined order; and
   means for chopper stabilizing said one stage of filtering at said predetermined chopping frequency, such that said low frequency noise is shifted up in frequency by said chopping frequency and the harmonics thereof, with the energy of said low frequency noise disposed about the harmonics of said chopping frequency.

2. The analog-to-digital converter of claim 1 wherein said analog modulator comprises a delta-sigma modulator operating at said sampling frequency for converting said analog input signal to a digital pulse stream.

3. The analog-to-digital converter of claim 1 and further comprising a digital filter for receiving the digital output of said analog modulator, and having a predetermined frequency response and sampling rate for providing a predetermined amount of attenuation over a predetermined frequency range to reject unwanted signals.

4. The analog-to-digital converter of claim 1 wherein the harmonics of said chopping frequency are odd harmonics.

5. The analog-to-digital converter of claim 1 wherein said at least one stage of filtering is a continuous time filter.

6. The analog-to-digital converter of claim 1 wherein said at least one stage of filtering includes an integrator.

7. The analog-to-digital converter of claim 1 wherein said analog-to-digital converter includes a digital-to-analog converter for converting the digital output to an analog signal to be fed back to the input, the digital-to-analog converter having noise associated therewith and being chopper stabilized at said chopping frequency.

8. The analog-to-digital converter of claim 1 wherein said predetermined sampling frequency substantially equals said chopping frequency.

9. An analog-to-digital converter, comprising:
   a delta-sigma modulator for receiving an analog input signal and converting the received analog input signal to a digital output that has a value proportional to the analog input signal, said delta-sigma modulator operating at a predetermined sampling frequency;
   a digital filter for receiving the digital signal output of said modulator and having a predetermined frequency response for providing a predetermined amount of rejection over a defined frequency range of rejection to reject unwanted signals;
   said delta-sigma modulator having at least one stage of filtering, said one stage of filtering having low frequency noise associated therewith, and said delta-sigma modulator having a noise transfer function that provides a substantial amount of attenuation at said predetermined sampling frequency; and
   said one stage of filtering in said delta-sigma modulator being chopper-stabilized at a predetermined chopping frequency that is substantially equal to said predetermined sampling frequency, such that the energy in the low frequency noise is transposed upward in frequency by said chopping frequency and the harmonics thereof.

10. The analog-to-digital converter of claim 9 wherein said delta-sigma modulator includes an integrator.

11. The analog-to-digital converter of claim 10 wherein said one stage of integration operates in a continuous time mode.

12. The analog-to-digital converter of claim 11 wherein said delta-sigma modulator includes at least a second stage of filtering, said second stage of filtering operating in a discrete time mode.

13. The analog-to-digital converter of claim 9 wherein the modulator has a zero disposed noise transfer function at said predetermined sampling frequency to provide a substantial amount of attenuation at said predetermined sampling frequency.

14. The analog-to-digital converter of claim 9 wherein said analog-to-digital converter includes a digital-to-analog converter for converting the digital output to an analog signal to be fed back to the input, the digital-to-analog converter having noise associated therewith and being chopper stabilized at said chopping frequency.

15. A method for converting an analog input signal to a digital signal, comprising:
   providing an analog modulator having at least one filter section operating at a predetermined sampling frequency to convert the analog input signal to a digital output signal that has a ones density that is proportional to the analog input signal;
   passing the analog input signal through the analog modulator;
   passing the analog input signal through the analog modulator;

providing a substantial amount of attenuation in the noise frequency response of the analog modulator proximate to a predetermined chopping frequency; and chopper stabilizing the one filter section at the chopping frequency to transpose low frequency noise energy up in frequency about the harmonics of the chopping frequency.

16. The method of claim 15 and further comprising filtering in the digital domain the digital output signal of the analog modulator to provide a predetermined amount of attenuation for a predetermined frequency range to reject unwanted signals.

17. The method of claim 15 wherein the filter section includes an integrator.

18. The method of claim 17 wherein the step of providing attenuation in the noise frequency response of the analog modulator includes providing a zero at the predetermined chopping frequency in the analog modulator.

19. The method of claim 15 wherein the analog modulator is a delta-sigma modulator.

20. The method of claim 19 wherein at least one integrator is incorporated in the filter section and the one integrator operates in a continuous time mode.

21. The method of claim 20 and further comprising providing in the delta-sigma modulator a second integrator operating in a discrete time mode.

22. The method of claim 15 wherein the predetermined chopping frequency substantially equals the predetermined sampling frequency.

* * * * *